(12) United States Patent
Behl

(10) Patent No.: US 7,420,801 B2
(45) Date of Patent: *Sep. 2, 2008

(54) DOCKING APPARATUS FOR PC CARD DEVICES

(75) Inventor: Sunny Behl, San Jose, CA (US)

(73) Assignee: Steinbeck Cannery LLC, Los Altos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/514,800

(22) Filed: Aug. 31, 2006

(65) Prior Publication Data

US 2006/0292918 A1  Dec. 28, 2006

Related U.S. Application Data

(63) Continuation of application No. 10/980,931, filed on Nov. 3, 2004, now Pat. No. 7,150,644, which is a continuation of application No. 09/182,842, filed on Oct. 29, 1998, now Pat. No. 6,840,801.

(51) Int. Cl.
G06F 1/16 (2006.01)

(52) U.S. Cl. .................................................. 361/685

(58) Field of Classification Search ............... 439/76.1, 439/374, 377, 928.1, 945, 296, 297, 298; 361/684, 685, 686, 695, 737, 687
See application file for complete search history.

(56) References Cited

U.S. PATENT DOCUMENTS

| | | | |
|---|---|---|---|
| 2,186,813 A | 1/1940 | Adam et al. | |
| 4,941,841 A | 7/1990 | Darden et al. | |
| 5,079,438 A | 1/1992 | Heung | |
| 5,171,183 A | 12/1992 | Pollard et al. | |
| 5,184,282 A | 2/1993 | Kaneda | |
| 5,289,339 A | 2/1994 | Akashi et al. | |
| 5,324,204 A | 6/1994 | Lwee | |
| 5,400,216 A | 3/1995 | Tsai | |
| 5,408,386 A | 4/1995 | Ringer | |
| 5,438,359 A | 8/1995 | Aoki | |
| 5,457,601 A | 10/1995 | Georgopulos et al. | |
| 5,475,563 A * | 12/1995 | Donahoe et al. | 361/695 |
| 5,519,571 A | 5/1996 | Shieh | |
| 5,583,745 A | 12/1996 | Uwabo et al. | |
| 5,625,534 A | 4/1997 | Okaya | |

(Continued)

FOREIGN PATENT DOCUMENTS

JP  8-339427 A  12/1996

OTHER PUBLICATIONS http://carry.com.tw/products/pica.htm.

*Primary Examiner*—Neil Abrams
(74) *Attorney, Agent, or Firm*—Perkins Coie LLP

(57) ABSTRACT

A carrier and docking assembly in combination for removeably interconnecting a PC card device with a computer. The docking assembly is configured in size to be fixed in a memory storage device bay of a computer housing, or a memory storage device housing. The docking assembly includes a plug for the carrier, a power connector and an interface connector. The interface connector is adapted for connection with an IDE ribbon cable. The carrier includes a PC card device for receiving PC cards and a plug for interconnection with the docking assembly. The carrier plug removeably couples with the plug of the docking assembly.

17 Claims, 3 Drawing Sheets

U.S. PATENT DOCUMENTS

| | | |
|---|---|---|
| 5,642,259 A | 6/1997 | Ma |
| 5,673,029 A | 9/1997 | Behl et al. |
| 5,694,290 A | 12/1997 | Chang |
| 5,729,060 A | 3/1998 | Shih |
| 5,801,922 A | 9/1998 | Shen et al. |
| 5,808,667 A | 9/1998 | Wang |
| 5,847,932 A | 12/1998 | Kantner |
| 5,862,037 A | 1/1999 | Behl |
| 5,867,417 A | 2/1999 | Wallace |
| 5,877,488 A | 3/1999 | Klatt et al. |
| 5,886,639 A | 3/1999 | Behl et al. |
| 5,898,568 A | 4/1999 | Cheng |
| 5,978,219 A | 11/1999 | Lin |
| 5,980,276 A | 11/1999 | Arita et al. |
| 5,982,624 A | 11/1999 | Onoda et al. |
| 6,031,718 A * | 2/2000 | Suzuki et al. ............... 361/695 |
| 6,061,236 A | 5/2000 | Klein |
| 6,104,607 A | 8/2000 | Behl |
| 6,108,195 A | 8/2000 | Behl et al. |
| 6,137,710 A | 10/2000 | Iwasaki et al. |
| 6,137,759 A * | 10/2000 | Ogiro et al. ................. 720/640 |
| 6,142,796 A | 11/2000 | Behl et al. |
| 6,185,097 B1 | 2/2001 | Behl |
| 6,193,339 B1 | 2/2001 | Behl et al. |
| 6,319,116 B1 | 11/2001 | Behl |
| 6,381,662 B1 | 4/2002 | Harari |
| 6,473,297 B1 | 10/2002 | Behl et al. |
| 6,565,163 B2 | 5/2003 | Behl et al. |
| 6,628,518 B2 | 9/2003 | Behl et al. |
| 6,676,505 B2 | 1/2004 | Behl |
| 6,840,801 B1 | 1/2005 | Behl |

* cited by examiner

DOCKING APPARATUS FOR PC CARD DEVICES

CROSS-REFERENCES TO RELATED APPLICATIONS

This application is a continuation of U.S. patent application Ser. No. 10/980,931, filed on Nov. 3, 2004, which is a continuation application of U.S. patent application Ser. No. 09/182,842, filed on Oct. 29, 1998, both of which are herein incorporated by reference in their entirety for all purposes.

FIELD OF THE INVENTION

The present invention pertains to memory storage devices and more particularly to mechanisms for docking PC card-type devices in memory storage device bays.

BACKGROUND OF THE INVENTION

PC cards are widely used in laptop computers for interconnecting devices including modems, network cards, flash memory, and miniature hard disk drives to the laptop computer. One major benefit of the PC cards is that they are very small. Some are sized smaller than credit-cards.

PC cards are now being used in cameras and other devices for storing data, sound and images. Some digital cameras have PC card technology, including flash memory, to record digital photographs. PC cards are removable from the camera to transport the images to a laptop or other computer. Accordingly, the recorded image can be viewed and/or printed. Most laptop computers have PC card slots built in.

Although the demand for PC card based devices such as digital cameras has increased in recent years, many desk top type personal computers are not specifically adapted to accommodate PC cards. Various externally connectable PC card devices have been developed. A typical externally connectable PC card device plugs into the parallel, or serial port of a standard personal computer. Power is supplied to the PC card device from an external plug, or from a keyboard connection, for example.

Many computer users have speakers, printers, scanners, lamps and other power drawing devices plugged in near the computer system creating a tangled mess of wire. Additional wires for a PC card device are undesirable. What is desired is a PC card device that does not require additional wires and which conveniently connects to a personal computer.

FIG. 1 shows a docking assembly 10 and carrier 12. The docking assembly 10 is fixed in a hard drive bay of a typical personal computer 14. The personal computer 14 has an internal power supply 16 and an IDE ribbon cable 18. The docking assembly 10 couples with the power supply 16 and the IDE ribbon cable 18 of the computer 14. The docking assembly 10 includes a plug 20 for receiving the carrier 12.

The carrier 12 includes a base 22 and a cover 24 for housing a hard drive 26. The carrier 12 slides into the docking assembly 10 to couple the hard drive 26 with the power supply 16 and the IDE ribbon cable 18. Computer users rely on carriers 12 to selectively interconnect multiple disk drives to the personal computer 14 having a docking assembly 10.

BRIEF SUMMARY OF THE INVENTION

The present invention is a way of providing a way of interconnecting a PC card device to a personal computer. This is accomplished in a simple way without an excessive bundle of wires, or external power connections. Since personal computers typically have a limited number of IDE connections and memory storage device bays, the carrier of the present invention is removable to enable sharing of the IDE connection and memory storage device bay, when a PC card is not in use.

The present invention includes a carrier and a docking assembly. The docking assembly is configured to be fixed in a standard-sized bay of a computer housing, or memory storage device housing. The docking assembly includes a pair of lateral sides for fixing the docking assembly in a memory storage device bay. Preferably, the docking assembly has a width of 5¼ inches for inserting the carrier in a 5¼ inch memory storage bay. Alternatively, the docking assembly has a width of 3½ inches for inserting the carrier in a 3½ inch memory storage bay.

The docking assembly also includes a power connector and an IDE cable connector for coupling the docking assembly to a power source and an IDE interface, respectively. The docking assembly also includes a docking assembly plug for removeably receiving the carrier. The carrier includes a PC card device and adapter circuitry including a plug. The PC card device receives PC cards and the plug removeably couples the carrier with the docking assembly plug.

DETAILED DESCRIPTION OF THE INVENTION

Figure 1:
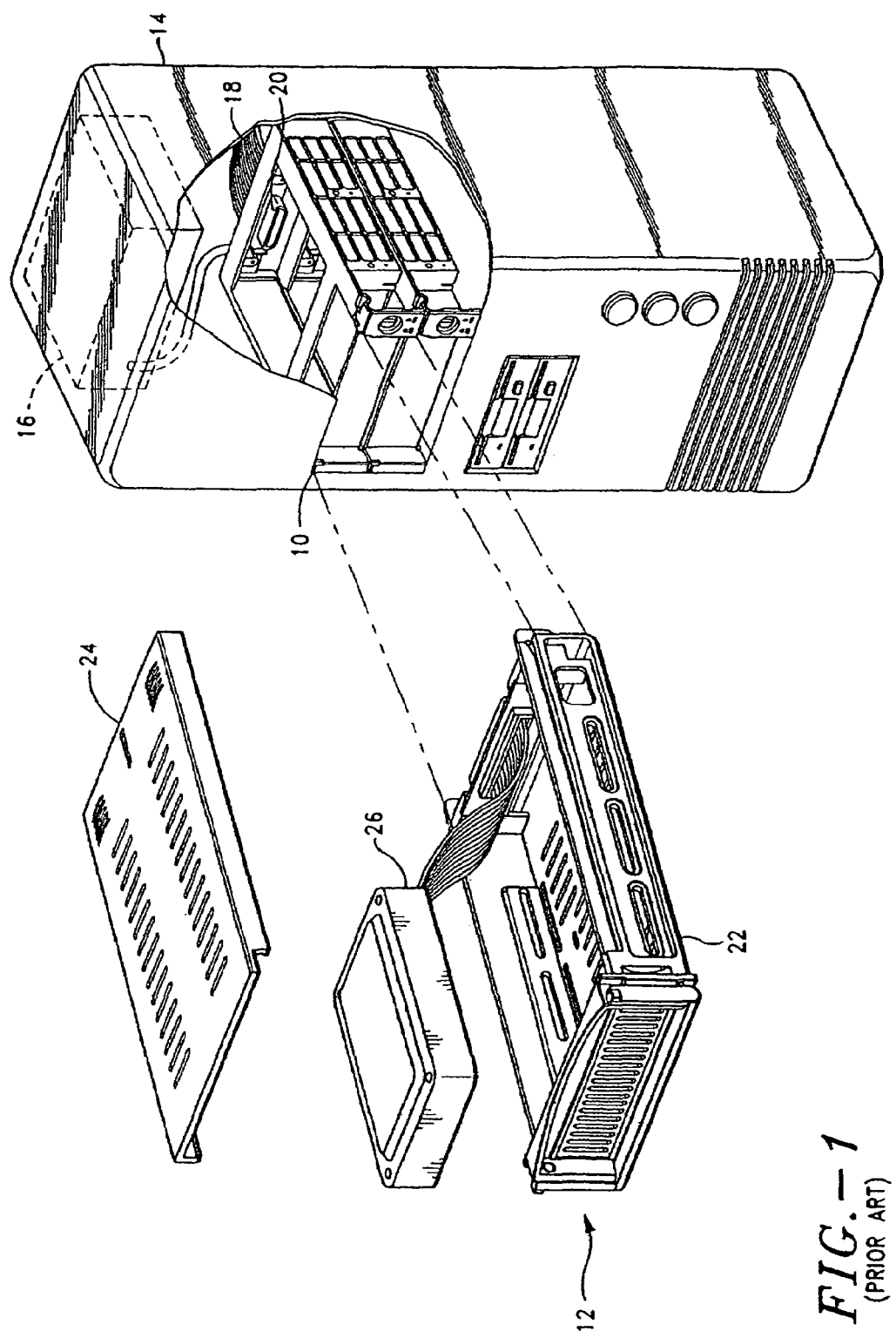
FIG. 1 is a perspective view of a known hard disk drive docking assembly and carrier.
Figure 2:
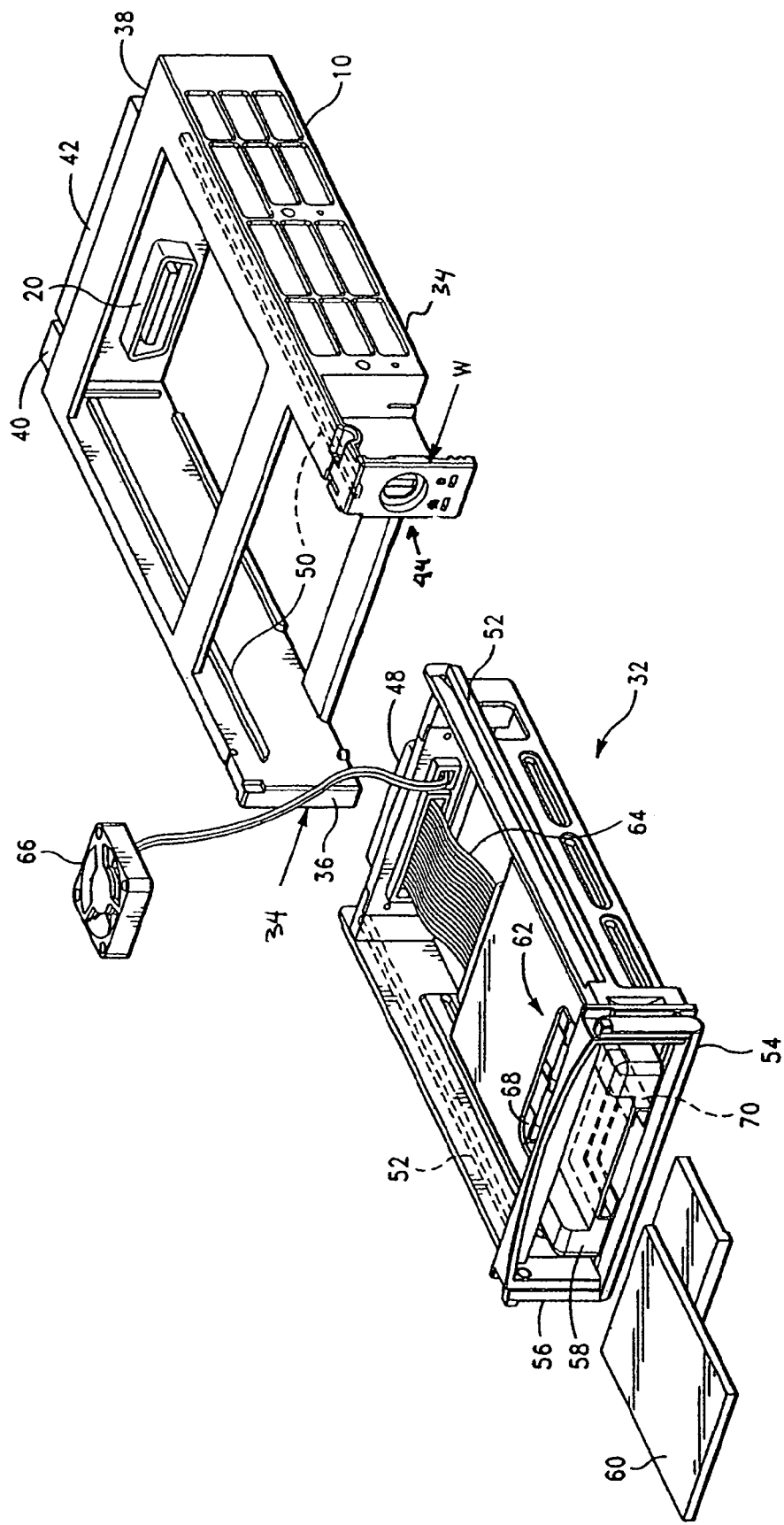
FIG. 2 is an exploded perspective view of a PC card carrier in accordance with the present invention.

FIG. 2 shows a docking assembly 10 and a carrier 32. The docking assembly 10 is adapted for coupling with an IDE ribbon cable. The docking assembly 10 includes a pair of lateral sides 34. The sides fix the docking assembly 10 within a memory storage device bay of a personal computer, for example, to enable the docking assembly to couple with the IDE ribbon cable in the personal computer. It can be appreciated, however, that the present invention can also be used in a memory storage device housing, or other housing having a memory storage device bay. Further, although an IDE ribbon cable interface is shown, the docking assembly 10 and carrier 32 combination can be configured for use with a SCSI or other desired interface. As various interface standards evolve, the docking assembly 10 and carrier 32 combination can be adapted to fit each of those standards without departing from the scope and spirit of the invention.

The docking assembly 10 has a front 36 and a rear 38. The rear 38 includes a power connector 40 and a ribbon cable connector 42. The front 36 includes a lock 44 for holding the carrier 32 within the docking assembly 10.

The docking assembly 10 includes a width "w". The width "w" is 5¼ inches to fit in a 5¼ inch memory storage bay. In an alternate embodiment of the invention, the width "w" 3½ inches to fit in a 3½ inch memory storage bay. It can be appreciated that although this invention is configured in size to fit in standard memory storage bay sizes, the invention can be adapted as the memory storage bay size standards evolve.

The docking assembly 10 includes a plug 20 for removeably coupling the carrier 32 to the docking assembly 10. The carrier 32 has a plug 48 for mating with the plug 20 of the docking assembly 10. The docking assembly 10 has rails 50 defined on each of the lateral sides 34 for guiding and aligning the carrier 32. The carrier 32 has rails 52 to mate with the rails 50 of the docking assembly 10.

The carrier 32 has a front 56, a fan 66 mounted in the carrier, a PC card device 62 and a folding handle 54. The folding handle 54 mounts on the front 56. The front 56 of the carrier 32 defines an opening for receiving a PC card. Although a folding handle 54 is shown, any handle type to enable removal of the carrier 32 from the docking assembly 10 will do.

The PC card device 62 has offset slots 68 and 70 (see FIG. 3) and mounts in the carrier 32 to receive PC cards. The PC card device 62 is adapted for PCMCIA standard type I, II, or III type flash memory cards. According to an aspect of the invention, the PC card device 62 is adapted for Compact Flash, ATA Flash, or PCMCIA hard disks. The PC card device 62 can be adapted to receive other cards of like, or smaller, sizes. The PC card device 62 is capable of reading and writing data to the PC cards. The PC card device 62 is adapted with plural card slots for receiving plural cards of different sizes.

The PC card device 62 can be coupled to circuitry 64 in the form of a ribbon cable (see FIG. 2). The circuitry 64 couples the PC card device 62 with the plug 48 so that the PC card device 62 can communicate with, for example, either an IDE or SCSI interface.

Figure 3:
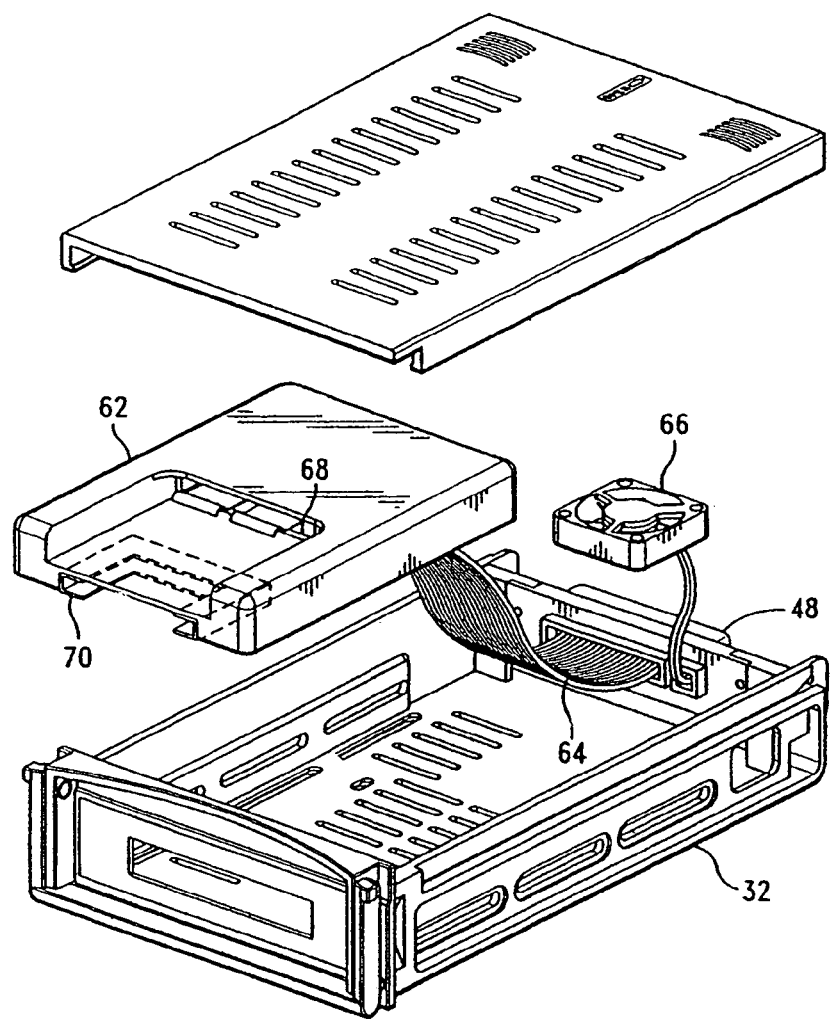
FIG. 3 is an exploded perspective view of a carrier including a fan.

FIG. 3 shows the PC card device 62 and a fan 66 mounted in the carrier 32. The fan 66 couples with the plug 48 (see FIG. 3) to draw power. It can be appreciated that the carrier 32 enables interconnection of any of a variety of devices, including PC card devices, hard disk drives, cooling fans, etc. to a docking assembly in a memory storage device bay.

Figure 4:
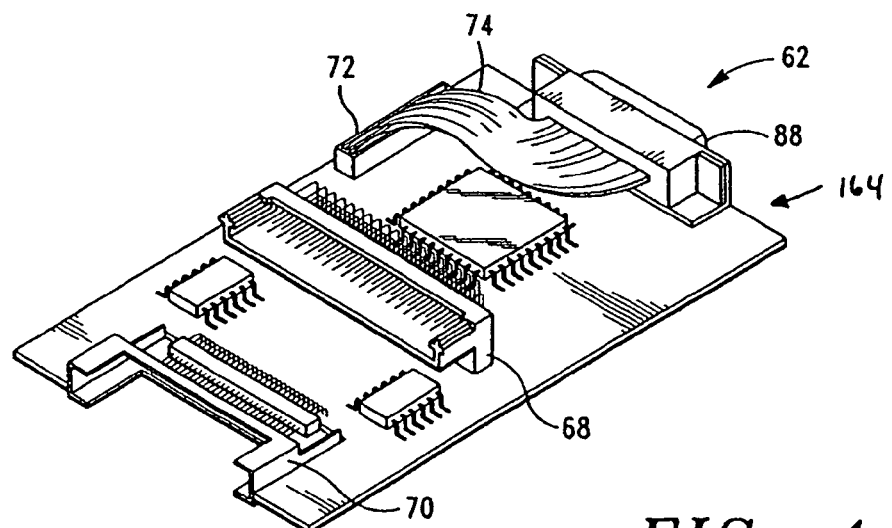
FIG. 4 is a perspective view of an embodiment of a circuit board design for the PC card carrier.

FIG. 4 shows a portion of the PC card device 62 including adapter circuitry 164. The circuitry includes a PCMCIA type III slot 68, a COMPACT FLASH slot 70, an IDE interface pin connector 72 and a plug 88. A ribbon cable 74 couples the pin connector 72 with the plug 88.

The circuitry 164 mounts in the carrier 32 (FIG. 3). Both slots 68 and 70 receive PC cards. The circuitry 164 adapts the PC card slots 68 and 70 to communicate with the IDE interface pin connector 72. Accordingly, the circuitry 164 enables PC cards to communicate with a docking assembly via the plug 48. The circuitry 164 is configured so that the PCMCIA slot 68 and the COMPACT FLASH slot 70 are offset so that both slots 68 and 70 can be used simultaneously.

This detailed description is presented by way of example only. Various modifications, additions and variations of the disclosed apparatus are possible. Accordingly, the invention is to be limited only by the claims below.

What is claimed is:

1. An assembly, comprising:
a docking assembly configured to be fixed in a bay of a computer, the docking assembly including a docking assembly plug, wherein the docking assembly is adapted to connect with an interface in the computer;
a carrier including a PC card device, a fan mounted in the carrier for cooling the carrier, and a carrier plug, wherein the carrier plug removeably interconnects with the docking assembly plug to enable the PC card device to communicate with the interface; and
adapter circuitry configured to couple the PC card device with the carrier plug, wherein the adapter circuitry includes a ribbon cable extending from a pin connector to the carrier plug.

2. The assembly of claim 1, wherein the docking assembly further comprises a power connector and a cable connector.

3. The assembly of claim 2, wherein the cable connector enables the docking assembly to connect with the interface.

4. The assembly of claim 1, wherein the docking assembly comprises a lock for holding the carrier within the docking assembly.

5. The assembly of claim 1, wherein the PC card device comprises at least one PC card slot.

6. The assembly of claim 1, wherein the PC card device is capable of receiving a Compact Flash, ATA Flash, or a PCMCIA card.

7. The assembly of claim 1, wherein the PC card device comprises at least two slots configured to be used simultaneously.

8. The assembly of claim 1, wherein the PC card device comprises a plurality of PC card slots having different sizes for receiving a plurality of cards having different sizes.

9. The assembly of claim 1, wherein the interface comprises an IDE or SCSI interface.

10. The assembly of claim 1, wherein the carrier comprises a folding handle mounted to a front of the carrier.

11. The assembly of claim 1, wherein the carrier has a handle for removing the carrier from the docking assembly and for carrying the carrier.

12. The assembly of claim 1, wherein the carrier and docking assembly have rails for aligning the carrier with the docking assembly.

13. A combination, comprising:
a rack configured to be fixed in a bay of a memory storage device, the rack including a first connector, wherein the rack is adapted to connect with an interface in the memory storage device;
a carrier including a PC card device, a fan mounted in the carrier for cooling the carrier, and a second connector, wherein the second connector removeably interconnects with the first connector to enable the PC card device to communicate with the; and
adapter circuitry configured to couple the PC card device with the second connector, wherein the adapter circuitry includes a ribbon cable extending from a pin connector to the second connector.

14. The combination of claim 13, wherein the rack further comprises a power connector and a cable connector.

15. The combination of claim 14, wherein the cable connector enables the rack to connect with the interface.

16. The combination of claim 13, wherein the rack comprises a lock for holding the carrier within the rack.

17. An assembly, comprising:
means for fixing a docking assembly in a bay of a computer;
means for connecting the docking assembly with an interface in the computer;
means for removeably interconnecting a carrier with the docking assembly, wherein the carrier comprises a PC card device, the carrier being removeably interconnected with the docking assembly such that the PC card device communicates with the interface;
means for coupling the PC card device to the docking assembly, the means for coupling including a ribbon cable coupling the PC card device to the docking assembly; and
means for cooling the carrier.

* * * * *